(12) United States Patent
McClannahan et al.

(10) Patent No.: US 7,157,948 B2
(45) Date of Patent: Jan. 2, 2007

(54) METHOD AND APPARATUS FOR CALIBRATING A DELAY LINE

(75) Inventors: Gary P. McClannahan, Rochester, MN (US); Daniel P. Wetzel, Rochester, MN (US); Gary M. Lippert, Kasson, MN (US)

(73) Assignee: LSI Logic Corporation, Milpitas, CA (US)

( * ) Notice: Subject to any disclaimer, the term of this patent is extended or adjusted under 35 U.S.C. 154(b) by 18 days.

(21) Appl. No.: 10/937,911

(22) Filed: Sep. 10, 2004

(65) Prior Publication Data

US 2006/0055441 A1    Mar. 16, 2006

(51) Int. Cl.
*H03L 7/00* (2006.01)
(52) U.S. Cl. ..................... 327/151; 327/160
(58) Field of Classification Search ..................... None
See application file for complete search history.

(56) References Cited

U.S. PATENT DOCUMENTS

| | | | | |
|---|---|---|---|---|
| 5,394,444 A | * | 2/1995 | Silvey et al. ............... 375/374 |
| 5,870,002 A | * | 2/1999 | Ghaderi et al. .............. 331/17 |
| 6,034,558 A | * | 3/2000 | Vanderschoot et al. ..... 327/277 |
| 6,084,933 A | * | 7/2000 | Kubinec ...................... 375/362 |
| 6,169,437 B1 | * | 1/2001 | Navarro et al. ............. 327/270 |
| 6,356,122 B1 | * | 3/2002 | Sevalia et al. .............. 327/105 |
| 6,496,043 B1 | | 12/2002 | Moss et al. .................... 327/12 |
| 6,509,762 B1 | | 1/2003 | Moss et al. .................... 327/12 |
| 6,784,707 B1 | * | 8/2004 | Kim et al. ................... 327/158 |
| 7,019,570 B1 | * | 3/2006 | Starr ........................... 327/156 |

* cited by examiner

*Primary Examiner*—Timothy P. Callahan
*Assistant Examiner*—Cassandra Cox
(74) *Attorney, Agent, or Firm*—Westman, Champlin & Kelly, P.A.

(57) ABSTRACT

A delay line calibration circuit and method are provided in which a programmable master delay line drives a delay clock and has a propagation delay that is a function of a delay setting. A delay counter is clocked by the delay clock and has a delay count. A reference counter is clocked by a reference clock and has a reference count. A control circuit controls the delay and reference counters, compares a representation of the delay count to a representation of the reference count and responsively generates a modified value for the delay setting to reduce a difference between the representations of delay count and the reference count.

22 Claims, 3 Drawing Sheets

METHOD AND APPARATUS FOR CALIBRATING A DELAY LINE

FIELD OF THE INVENTION

The present invention relates to semiconductor integrated circuits and more particularly to the calibration of a delay line to a reference clock signal.

BACKGROUND OF THE INVENTION

Delay lines are used within integrated circuits for a wide variety of applications, such as for adjusting or modifying the phase alignment between two signals. In one application, delay lines are used for aligning clock signals for capturing data within a data valid window. For example, certain types of memory devices generate a clock strobe signal having edges that are aligned with changes in the read data.

A double data rate (DDR) dynamic random access memory (DRAM) transfers data on each rising and falling edge of the clock strobe signal. A DDR DRAM therefore transfers two data words per clock cycle. A memory controller is often used to coordinate the transfer of data to and from a memory device, such a DDR DRAM. The memory controller provides a local clock signal to the memory device for synchronizing read and write operations. The clock strobe signal generated by the memory device with the read data has predefined phase constraints with respect to the local clock signal provided by the memory controller. The memory controller uses the clock strobe signal for determining when the read data is valid and can therefore be captured. The times at which the read data is captured are preferably synchronized to the clock strobe signal so as to capture the read data in the middle of the valid data window.

The clock strobe signal is therefore typically delayed through a delay line such that its transitions line up with the middle of the data valid window. The amount of delay provided by the delay line can vary with process, voltage and temperature changes. Therefore, the delay line is preferable programmable such that the settings of the delay line can be adjusted to make the propagation delay through the delay line a proper duration relative to a reference clock. An algorithm is used to determine the correct setting of the delay line, and this algorithm is continually executed to keep the delay line calibrated to an optimum value with changes in voltage and temperature.

A typical calibration circuit uses an analog or digital delay lock loop (DLL) for calibrating the delay setting to the reference clock. Current DLL circuits include a slave delay line having multiple, cascaded delay cells which, when set properly, have a total propagation delay that is equal to the period of the reference clock. A circuit compares the phases of the rising and falling edges of the reference clock with the phase of the output from the DLL and then adjusts the delay setting in the DLL so that the delay is equal to the period of the reference clock. At this point, the delay through each slave delay cell equals a desired fraction of the reference clock period. The delay setting for the slave delay line can then be used to delay the clock strobe signal by the desired fractional amount of the reference clock.

These types of calibration circuits usually require several iterations in order to lock in on a proper delay setting. After each iteration, a binary search of delay values or another type of algorithm is used to determine the delay setting for the next iteration of the calibration attempt. If a large number of iterations is required, this can adversely affect the efficiency of the calibration circuit. Another disadvantage of a binary search algorithm and potentially other algorithms is that it is possible to overshoot the desired delay line setting. If the slave delay line in the calibration circuit is used within a ring oscillator, overshooting the delay line setting can temporarily create a very high frequency system that makes meeting design timing difficult. In addition, multiple delay cells are required, thus adding area to the design. A further disadvantage is that a fixed number of delay cells causes the single cell delay value to be a fixed fractional value of the reference clock, thus making the circuit unable to lock on to other fractional values of the reference clock.

Improved methods and apparatus are therefore desired for calibrating a delay line to a reference clock.

SUMMARY OF THE INVENTION

One embodiment of the present invention is directed to a delay line calibration circuit, which includes a programmable master delay line, a delay counter, a reference counter and a control circuit. The master delay line drives a delay clock and has a propagation delay that is a function of a delay setting. The delay counter is clocked by the delay clock and has a delay count. The reference counter is clocked by a reference clock and has a reference count. The control circuit controls the delay and reference counters, compares a representation of the delay count to a representation of the reference count and responsively generates a modified value for the delay setting to reduce a difference between the representations of delay count and the reference count.

Another embodiment of the present invention is directed to a data capture circuit. The data capture circuit includes a reference clock, a data input and a strobe input, which has a predefined phase relationship with the data input. A data capture element captures the data input as a function of a delayed strobe signal. A programmable slave delay line is coupled to the strobe input and generates the delayed strobe signal at an output thereof. The slave delay line has a propagation delay that is a function of a delay setting. A programmable master delay line drives a delay clock and has a propagation delay that is also a function of the delay setting. A delay counter is clocked by the delay clock and has a delay count. A reference counter is clocked by the reference clock and has a reference count. A control circuit controls the delay and reference counters, compares a representation of the delay count to a representation of the reference count and responsively generates a modified value for the delay setting to reduce a difference between the representations of delay count and the reference count.

Another embodiment of the present invention is directed to a method of calibrating propagation delay through a programmable delay line to a reference clock. The method includes: (a) generating a delay clock with a clock generator having a programmable master delay line, which controls a period of the delay clock based on a delay setting; (b) initiating a delay counter, which is clocked by the delay clock and has a delay count; (c) initiating a reference counter, which is clocked by the reference clock and has a reference count, when the delay counter is initiated in (b); and (d) comparing a representation of the delay count to a representation of the reference count when the reference count reaches a terminal count and responsively generating a modified value for the delay setting to reduce a difference between the representations of delay count and the reference count.

DETAILED DESCRIPTION OF ILLUSTRATIVE EMBODIMENTS

Figure 1:
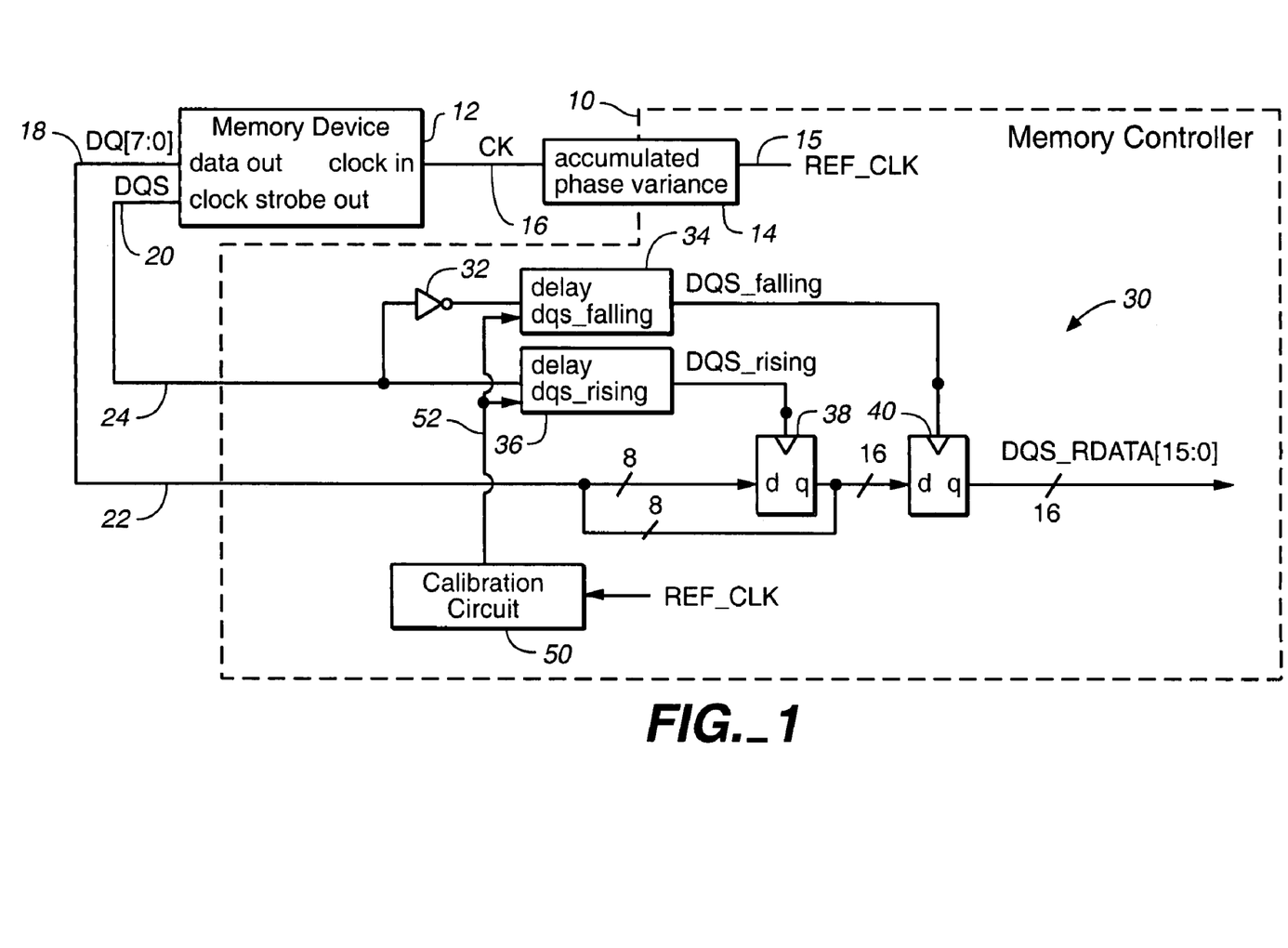
FIG. 1 is a schematic diagram of a data capture circuit in which one embodiment of the present invention is useful.

FIG. 1 is a schematic diagram illustrating an example of an application in which one embodiment of the present invention is useful. FIG. 1 illustrates a memory controller 10 coupled to a memory device 12. Memory control 10 has an internal reference clock REF_CLK, which is used for synchronizing various functions within the memory controller including the capture of data received from memory device 12 and for synchronizing read and write operations within memory device 12 through clock output 15.

In the example shown in FIG. 1, memory device 12 is a double data rate (DDR) dynamic random access memory (DRAM) having a clock input 16 labeled "CK", an 8-bit data output 18 labeled "DQ[7:0]" and a data clock strobe output 20 labeled "DQS". Clock input 16 is coupled to clock output 15 of memory controller 10 for receiving the memory controller's local clock signal REF_CLK. The clock signal "CK" received at clock input 16 is related to memory controller clock CLK but has an accumulated phase variance 14 on initial conditions such as process variations, PC board characteristics, etc. In addition, the phase difference can vary over time due to power fluctuations and variations in voltage and temperature.

When performing a read operation, memory device 12 generates a data clock strobe signal DQS on clock strobe output 20 which has a specified phase relationship to the input clock signal CK. Memory device 12 also provides an 8-bit data word DQ[7:0] on data output 18, which is aligned with DQS. In the case of a DDR memory device, the data on data output 18 changes on both the rising and falling edges of DQS.

Data output 18 and clock strobe output 20 are coupled to data input 22 and clock strobe input 24, respectively, of memory controller 10. Inputs 22 and 24 are coupled to a data capture circuit 30 within memory controller 10 for capturing the data words DQ[7:0] provided by memory device 12. Data capture circuit 30 includes inverter 32, programmable slave delay lines 34 and 36 and data capture elements 38 and 40. In one embodiment, data capture elements 38 and 40 include D-type flip-flops, which capture data on the rising edges of the clock signals that are applied to the elements. The data capture elements can include any type of memory elements, such as flip-flops, latches, registers, etc.

Programmable slave delay line 36 is coupled between clock input 24 of memory controller 10 and the clock input of data capture element 38. Delay line 36 generates a delayed clock strobe signal DQS_RISING which has a rising edge that is delayed from the rising edge of DQS by approximately ¼ of the period of the REF_CLK signal. Clock input 24 is also coupled to the clock input of data capture element 40 through inverter 32 and programmable slave delay line 34. Inverter 32 and delay line 34 generate an inverted, delayed clock strobe signal DQS_FALLING, which has a rising edge that is delayed from the falling edge DQS by approximately ¼ of the REF_CLK period. With the ¼ clock period delay, DQS_RISING and DQS_FALLING are preferable aligned to capture the data words at approximately the center of the data valid windows. However, delay lines 34 and 36 can delay DQS_RISING and DQS_FALLING by other fractional delays of the REF_CLK period in alternative embodiments or with other settings. With the above-described configuration, two data words are captured during each cycle of DQS.

In the embodiment shown in FIG. 1, data capture element 38 is an 8-bit latch formed of an array of eight D-type flip-flops. The data inputs of data capture element 38 are coupled to data input 22 for receiving the 8-bit data words DQ[7:0] from memory device 12. On each rising edge DQS_RISING (the delayed rising edged of DQS) data capture element 38 captures the data word on DQ[7:0] that was provided by memory device 12 with the rising edge of DQS.

Data capture element 40 is a 16-bit latch formed of an array of sixteen D-type flip-flops. A first set of the data inputs to data capture element 40 are coupled to data input 22 for receiving the 8-bit data words DQ[7:0] from memory device 12. A second set of the data inputs to data capture element 40 are coupled to the 8-bit data output of data capture element 38. On each rising edge of DQS_FALLING (the delayed falling edge of DQS), data capture element 40 captures the 8-bit data word DQ[7:0] that was provided by memory device 12 with the falling edge of DQS and the 8-bit data word DQ[7:0] that was captured by data capture element 38 (with the rising edge of DQS). Data capture element 40 has a 16-bit data output DQS_RDATA[15:0], which reflects the two captured data words read from memory device 12 with each cycle of DQS.

As mentioned above, the phase alignment of DQS relative to the data is preferably adjusted such that the transitions of DQS_RISING and DQS_FALLING line up with the middle of the data valid window. However, the amount of delay provided by delay lines 34 and 36 can vary with process, voltage and temperature (PVT) conditions. Calibration circuit 50 therefore adjusts the delay settings of delay lines 34 and 36 such that the propagation delays through delay lines 34 and 36 are a proper duration relative to reference clock REF_CLK. However, any suitable clock signal can be used as a reference. During operation of memory controller 10, calibration circuit 50 calibrates the propagation delays to the reference clock period by providing updated delay settings to the delay lines through slave control output 52. These calibration cycles can be performed continually or at any suitable time.

Figure 2:
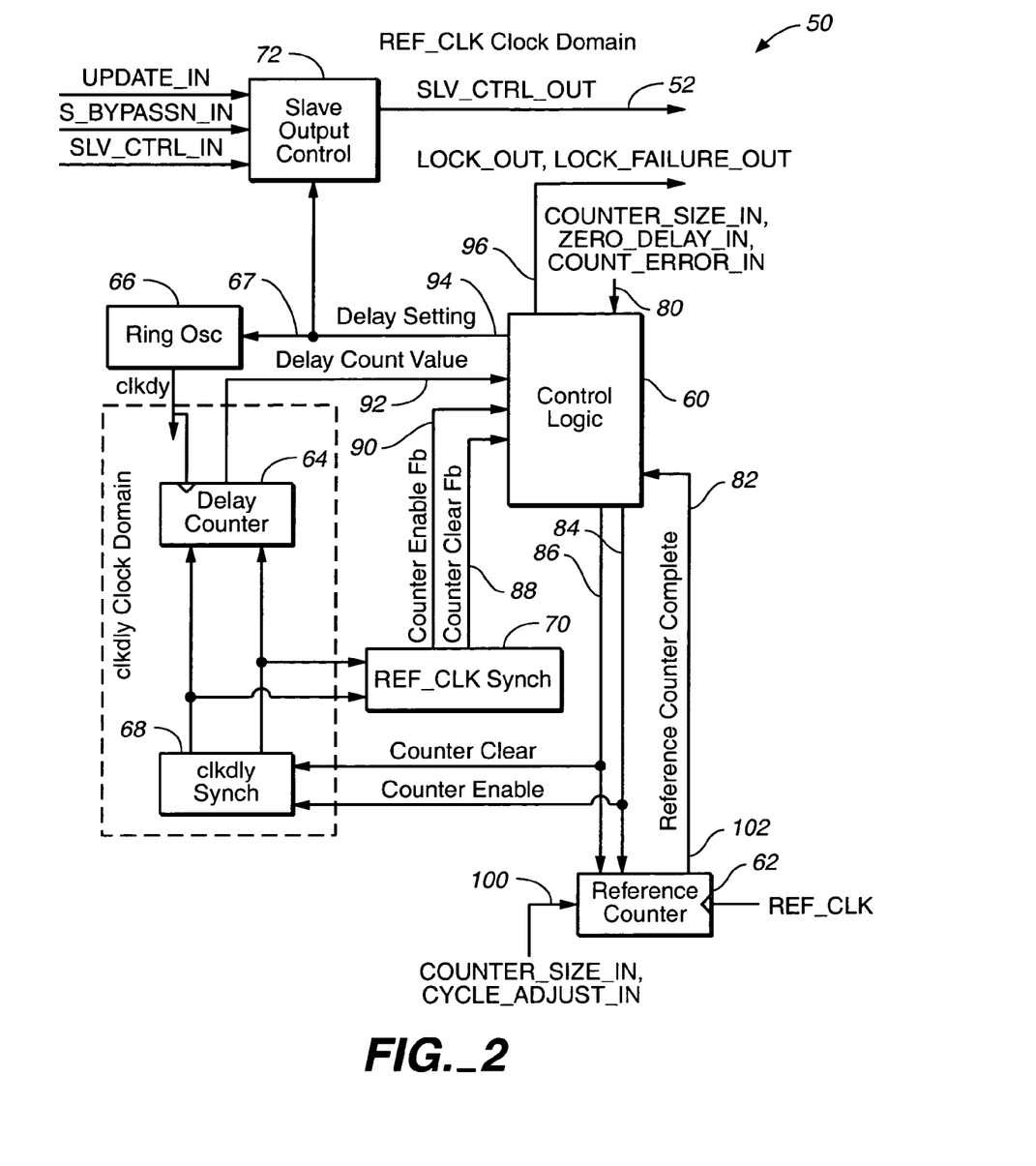
FIG. 2 is a block diagram of a calibration circuit according to one embodiment of the present invention.

FIG. 2 is a block diagram illustrating calibration circuit 50 in greater detail, according to one embodiment of the present invention. Calibration circuit 50 includes control logic 60, reference counter 62, delay counter 64, ring oscillator 66, clock synchronization circuits 68 and 70, and slave output control 72. Control logic 60, reference counter 62, synchronization circuit 70 and slave output control 72 reside in the REF_CLK clock domain and have elements that are clocked by REF_CLK or a similar clock signal. Delay counter 64 and synchronization circuit 68 reside in a delayed clock domain and have sequential elements that are clocked by delayed clock signal "CLKDLY" produced by ring oscillator 66.

In one embodiment, ring oscillator 66 includes a master programmable delay line having an output which is inverted and fed back to an input of the delay line to form the ring oscillator. For example, the master delay line in ring oscillator 66 can be an instantiation of the same delay line macrocell from which slave delay lines 34 and 36 in FIG. 1 are fabricated. Ring oscillator 66 has a delay setting input 67, which sets the propagation delay through the delay line. The delayed clock signal CLKDLY from ring oscillator 66 has a clock period that is approximately twice the propagation delay through the programmable delay line, as set by the current delay setting on input 67. CLKDLY is used to clock delay counter 64 and to clock synchronization registers in synchronization circuit 68. Reference counter 62 is clocked by the reference clock, REF_CLK.

Control logic 60 implements a calibration algorithm, which initiates counting by delay counter 64 and reference counter 62, compares the resulting count values and then adjusts the propagation delay in ring oscillator 66 until the delay is a desired fraction of the reference clock period. This delay setting can then be used to set the propagation delays in slave delay lines 34 and 36 in FIG. 1. In one embodiment control logic 60 is implemented as a state machine. However, control logic 60 can be implemented in other ways in alternative embodiments. For example, control logic 60 can be implemented in hardware, software or a combination of both hardware and software.

Control logic 60 includes one or more control inputs 80, a reference counter complete input 82, a counter enable output 84, a counter clear output 86, a counter clear feedback input 88, a counter enable feedback input 90, a delay count value input 92, a delay setting output 94, and one or more lock indicator outputs 96. Control inputs 80 receive one or more control signals, such as COUNTER_SIZE_IN, ZERO_DELAY_IN, and COUNT_ERROR_IN. COUNTER_SIZE_IN represents the size of reference counter 62 in terms of the number of bits in the counter that are enabled for counting. For example, a 10-bit counter counts to decimal 1023 and then rolls over, making the total number of cycles 1024, while and 11-bit counter counts to decimal 2047 and then rolls over, making the total number of cycles 2048. Control logic 60 uses the COUNTER_SIZE_IN value when making calculations as to the proper delay setting on output 94 based on a comparison with the count divided by delay counter 64.

ZERO_DELAY_IN represents the delay through the programmable delay line in ring oscillator 66 when delay setting output 94 is set to a zero value. Although the delay setting is set to zero, the delay line has some inherent delay. This value can be used for correcting the count produced by delay counter 64 to obtain a more accurate delay setting. COUNT_ERROR_IN represents the maximum difference between a normalized delay counter value and the reference counter value for which the propagation delay in the delay line within oscillator 66 is sufficiently close to the desired fraction of the reference clock period.

At the beginning of a calibration cycle, control logic 60 resets counters 62 and 64 through counter clear output 86 and enables the counters to begin counting through counter enable output 84. Reference counter 62 has one or more control inputs 100, including COUNTER_SIZE_IN and CYCLE_ADJUST_IN. COUNTER_SIZE_IN can be used to set the number of bits and therefore the maximum, terminal count of reference counter 62. As described in more detail below, CYCLE_ADJUST_IN can be used in conjunction with COUNTER_SIZE_IN to set the terminal value to which the reference counter counts before rolling over. For example in one embodiment, these two control inputs are used to select one of four terminal count values. However, the terminal count value can be directly supplied to reference counter 62 in an alternative embodiment, such that any terminal count value can be selected.

The counter enable output 84 and the counter clear output 86 from control logic 60 are passed through CLKDLY synchronization circuit 68 before being applied to delay counter 64. Synchronization circuit 68 synchronizes the enable and clear control outputs to the CLKDLY clock domain. The synchronized enable and clear signals applied to the enable and clear inputs of delay counter 64 and are fed back to control logic 60 through REF_CLK synchronization circuit 70. Circuit 70 re-synchronizes the clear and enable signals to the REF_CLK clock domain and applies these signals to counter clear feedback input 88 and counter enable feedback input 90 of control logic 60. Control logic 60 uses these feedback signals to verify that each enable or clear command has been executed within the CLKDLY clock domain before the control logic proceeds with the next step with the calibration algorithm.

When enabled, reference counter 62 and delay counter 64 each count at their respective rates, as set by the periods of the reference and delay clock signals. Once reference counter 62 reaches the predetermined terminal count, reference counter 62 activates reference counter complete output 102. This signals control logic 50 to disable reference counter 62 and delay counter 64 through counter enable output 84 and to read the corresponding delay count value on input 92.

As described in more detail below, the control logic 60 normalizes the delay count value and then compares a representation of the normalized delay count value to a representation of the reference count terminal value. Control logic 60 then generates a modified value for the delay setting on output 94 to reduce a difference between the representations of delay count value and the reference count value. If the normalized delay count value is within a predetermined number of counts of the reference count terminal value, then control logic 60 activates the LOCK_OUT output on lock output 96. If control logic 60 fails to obtain a lock over a predetermined number of iterations, control logic 60 activates LOCK_FAILURE_OUT.

In one implementation, reference counter 62 has ten bits, but delay setting 94 has only eight bits. Therefore, the delay setting 94 does not have the same resolution as the reference counter. In this case, the difference value that is used to set the delay setting may have ten bits, so only the eight most significant bits are used. The ninth bit is added in to the eight most significant bits of the difference value for rounding.

In the embodiment described above, the master delay line in oscillator 66 has a propagation delay that is preferably ¼ the reference clock period. Therefore, the delayed clock signal CLKDLY from ring oscillator 66 preferably has a period that is approximately ½ the reference clock period. Therefore, to normalize the delay count value received on input 92, control logic 60 divides the delay count value by two prior to comparing it to the terminal count of reference value 62.

If the normalized delay count value is more than the terminal count of reference counter 62, the delay line in ring oscillator 66 is running too fast and its length needs to be increased. If the normalized delay count value is less than the reference clock terminal value, the delay line is running too slow and its length needs to be decreased.

The bits of the normalized delay count value that differ from corresponding bits in the terminal count value of the reference counter can be used to determine fractional amounts of the reference clock period by which to adjust the propagation delay through the master delay line.

Assume reference counter 62 has 10 bits enabled for counting. It counts from decimal 0 to decimal 1023 and triggers count complete output 102 to stop delay counter 64 on the rollover to 0 (i.e., on the effective count of 1024).

In hexadecimal, 1024 is 0x400, where the "0x" indicates that "400 represents a hexadecimal value. The delay counter counts to 2048, or 0x800 in hexadecimal. The control logic effectively divides the delay counter value by two to normalize it to a count of 1024.

Let's say at the end of a calibration iteration, the delay counter has decimal 2200 for a value. Decimal 2200 is 0x898 hexadecimal. Normalizing to the reference counter (i.e., dividing by 2), yields 0x44C. Since 0x44C is greater than 0x400, the delay counter run is running too fast.

Assume the current delay line control value on delay setting output 94 is 0xA0 or 160 decimal. Also assume that a delay line control value of 0 has a default value (ZERO_DELAY_IN) equivalent to an increment of decimal 16 or hexadecimal 0x10 in the delay setting. The effective total current delay line setting then is currently 160+16=176 or 0xB0.

As shown below, control logic 60 can use the bit positions of the normalized delay count value to determine a precise fractional amount by which to adjust the delay line control setting.

In the example, delay counter 62 counted to 0x44C rather than 0x400:
Terminal count=0x400=binary 0100 0000 0000
Delay count=0x44C=binary 0100 0100 1100
Difference=0x04C=binary 0000 0100 1100

Every logic "1" bit to the right of the bit that represents 1024 (0x400) in the delay count indicates a binary fractional amount by which the delay count differs from the terminal count. As shown in Table 1, for example, 0x200 would be ½ of 0x400. 0x100 would be ¼ of 0x400. 0x080 would be ⅛ of 0x400 and so on. In the above-example, the bits that are set in the 0x04C difference represent binary fractional amounts of $\frac{1}{16}$, $\frac{1}{128}$ and $\frac{1}{256}$ as shown in Table 1:

TABLE 1

| 0x400 | 0 | 1 | 0 | 0 | 0 | 0 | 0 | 0 | 0 | 0 | 0 | 0 |
|---|---|---|---|---|---|---|---|---|---|---|---|---|
| 0x44C | 0 | 1 | 0 | 0 | 0 | 1 | 0 | 0 | 1 | 1 | 0 | 0 |
| 0x04C Difference | 0 | 0 | 0 | 0 | 0 | 1 | 0 | 0 | 1 | 1 | 0 | 0 |
| Fractional Difference | | ½ | ¼ | ⅛ | $\frac{1}{16}$ | $\frac{1}{32}$ | $\frac{1}{64}$ | $\frac{1}{128}$ | $\frac{1}{256}$ | $\frac{1}{512}$ | $\frac{1}{1024}$ | |

Thus, by comparing corresponding bit positions, control circuit 60 can easily calculate a modified value for the delay setting. In this example, the propagation delay through the master delay line needs to be increased by $\frac{1}{16}+\frac{1}{128}+\frac{1}{256}$ of the reference clock period.

Figure 3:
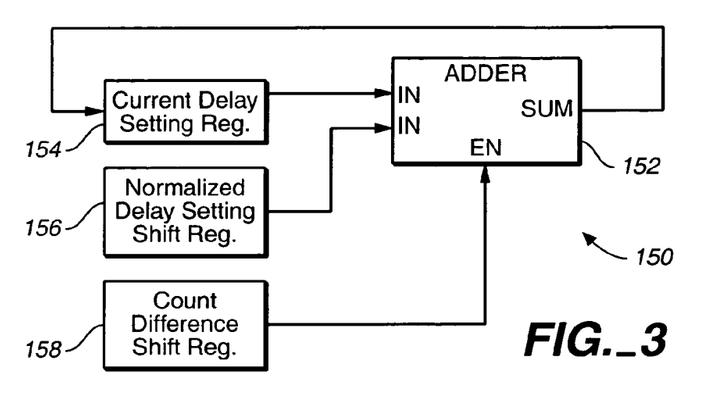
FIG. 3 is a block diagram of a comparison circuit used within the calibration circuit shown in FIG. 1 according to one embodiment of the present invention.

The bit comparison can be accomplished by any suitable circuit or algorithm. FIG. 3 is a block diagram illustrating one example of a suitable circuit 150 within control circuit 60 (shown in FIG. 2) for comparing the bit positions. Bit comparison circuit includes a pipelined adder 152, a current delay setting register 154, a normalized delay setting register 156, and a count difference shift register 158. Current delay setting register 152 is loaded with the current delay setting value and provides that value to delay setting output 94. Normalized delay setting shift register 156 is loaded with the effective current delay setting shifted to the right one bit position (effectively dividing by 2). Count difference register 158 is loaded with the difference between the normalized delay count and the terminal count of the reference counter (e.g., 0x04C in the above example).

The outputs of registers 154 and 156 are applied to the addend inputs of adder 152, and the sum output of adder 152 is fed back to the input of current delay setting register 154. The most significant bit position of count difference shift register 158 is applied as an enable input to adder 152. In each cycle of bit comparison circuit 150, the most significant bit of shift register 158 controls whether adder 152 actually operates or not. If this bit is set, the contents of shift register 156 are added to the contents of register 154 and the result is stored in register 154. If this bit in not set, adder 152 does not operate, and register 154 is not updated.

At the start of the next cycle, the shift register 158 containing the difference value is shifted to the left one bit position, and the shift register 156 containing the normalized delay setting is shifted one to the right one bit position (dividing it by 2). So the progression of values contained in the normalized delay setting register 156 is ½ the effective delay setting, ¼ the effective delay setting, ⅛ the effective delay setting, etc. Whether that value is added to the current delay setting in register 152 or not is controlled by the corresponding bit position in the difference value stored in shift register 158.

If the normalized delay count is less than the terminal count of reference counter 62, the delay line in oscillator 66 is running too slow. In that case control logic 60 calculates the 2's complement of the difference value and loads that value into shift register 158 to control the subtraction of the normalized delay setting in register 156 from the current delay setting in register 154 through adder 152, which is operated in a subtraction mode.

In this manner, bit comparison circuit 150 identifies each bit of the normalized delay count that differs from a corresponding bit of the terminal count of reference counter 62 and, for each differing bit, varies the delay setting by a corresponding binary fractional amount to thereby generate the modified value of the delay setting on output 94.

Referring back to FIG. 2, control logic 60 applies the modified value of the delay setting on output 94 to update the programmable delay line in ring oscillator 66. Control logic 60 then performs another iteration of the calibration algorithm. Once the difference between the normalized delay count and the terminal value of reference counter is less than or equal to the value indicated by COUNT_ERROR_IN, control logic 60 activates LOCK_OUT on output 96. If control logic 60 fails to obtain a lock after a predetermined number of iterations, control logic 60 activates LOCK_FAILURE_OUT.

The modified delay setting is also applied to slave output control circuit 72. Slave output control circuit 72 selectively applies the modified delay setting to SLV_CTRL_OUT on line 52 when UPDATE_IN is activated. This modified value is then applied to the delay control inputs of programmable delay lines 34 and 36 within data capture circuit 30 shown in FIG. 1. Alternatively, the surrounding control circuitry can override the delay setting calculated by calibration circuit 50 by applying a manual delay setting value to the SLV_CTRL_IN input of slave output control circuit 72 and activating the S_BYPASS_IN input.

Calibration circuit 50 can therefore calibrate the programmable master delay line in ring oscillator 66 and thus the programmable slave delay lines 34 and 36 (shown in FIG. 1) such that the propagation delays through these delay lines are ¼ of the reference clock period, for example. This delay allows data capture elements 38 and 40 to capture the incoming data near the center of the data valid windows in each half cycle of the clock strobe signal.

As mentioned above, the terminal count of reference counter 62 that is used by control circuit 60 can be altered to achieve propagation delays of different fractions of the reference clock period. Control logic 60 assumes that the target ratio of the delay count value to the reference count value is two. So, if the variable "D" is used for the delay count value and the variable "R" is used for the reference count value, control logic 60 expects D/R=2 for an ideal delay setting on output 94.

In one embodiment, control logic 60 assumes that reference counter 62 always counts until it rolls over at the terminal count, i.e., it counts to 1024 for a 10 bit counter, 2048 for an 11 bit counter, 4096 for a 12 bit counter, etc. If control inputs 100 are used to change the count value at which reference counter 62 signals control logic 60 that it is done counting, control logic 60 can be set to assume reference counter 62 has counted to the original terminal count and will therefore adjust the delay setting on output 94 until the delay count value is close to double the original terminal count of reference counter 62.

For example, assume reference counter 62 normally counts to 1024. For a proper delay setting, delay counter 64 should then count to 2048 when reference counter 62 is done counting. As mentioned above, D/R=2 or 2048/1024=2.

Now assume that reference counter 62 is actually controlled to count only to 819. Reference counter 62 will stop counting much sooner than it would when counting to 1024. Control logic 60 will see that the delay count value is much less than 2048 and will speed up the delay line in ring oscillator 66 on subsequent calibration attempts until the delay count value is satisfactorily close to 2048.

While control logic 60 believes it is maintaining a ratio of two, it is really maintaining a ratio of 2048/819=2.5, which is the ratio needed for the delay line to be set to ⅕ of the reference clock period. Therefore, the same control logic can be used while achieving different fractional delays of the reference clock period.

A fractional delay of ⅓ of the reference clock period would require a terminal value of 1365 (2048/1365=1.5). A fractional delay of ⅙ would require a terminal value of 682 (2048/682=3.0). A fractional delay of ⅐ would require a terminal value of 585 (2048/585=3.5). So in general, a 1/n fractional delay (where n is a reasonable number) can be achieved by setting the terminal value of reference counter 62 to: (target value of delay counter)/(n/2) or (2* target value of delay counter)/n.

Figure 4:
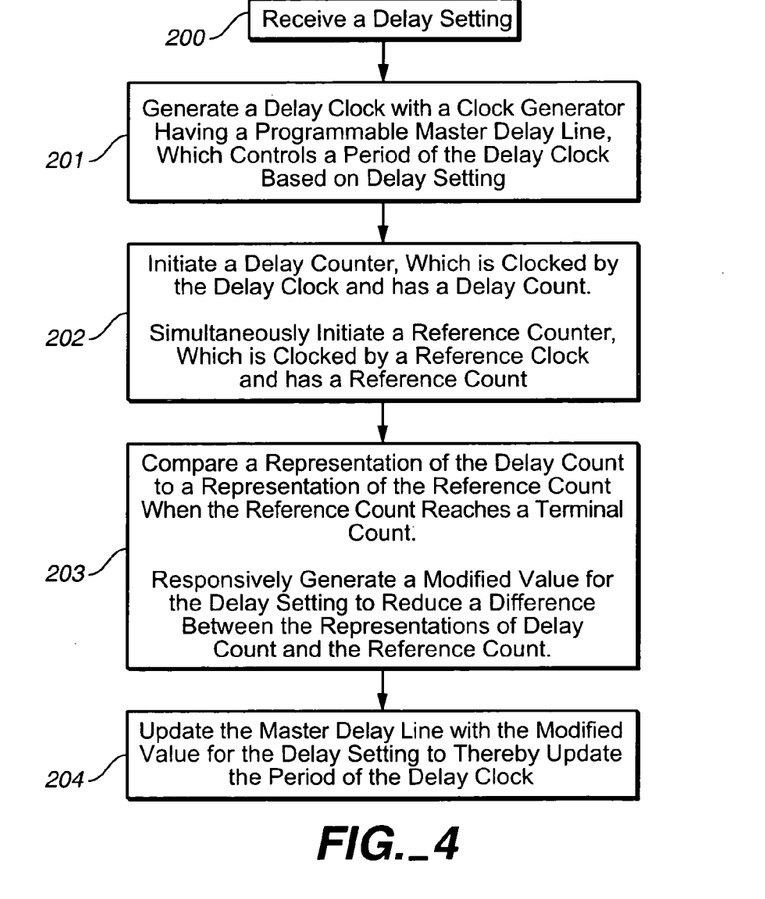
FIG. 4 is a flow chart of a calibration algorithm according to one embodiment of the present invention.

FIG. 4 is a flow diagram illustrating a method of calibrating a programmable delay line according to one embodiment of the present invention. At step 200, a current delay setting is received. At step 201, a clock generator generates a delay clock having a programmable master delay line. The master delay line controls a period of the delay clock based on the current delay setting. At step 202 a delay counter is initiated, which is clocked by the delay clock and has a delay count. At approximately the same time, a reference counter is initiated, which is clocked by a reference clock and has a reference count. When the reference count reaches a terminal count, a representation of the delay count is compared to a representation of the reference count and a modified value for the delay setting is generated to reduce a difference between the representations of delay count and the reference count.

The calibration circuit shown in FIGS. 1–3 and the calibration method shown in FIG. 3 can be used to obtain a fairly precise adjustment of a programmable delay line based on a calculated delay value that approaches a proper delay value in a very small number of iterations. In some embodiments, the proper delay value can be achieved in a single iteration or in two or three iterations, for example. If the initial delay value is set to some value that is guaranteed to be too long in all cases of process, voltage and temperature, the calibration circuit can be kept at an overall average lower frequency during calibration than with a binary search algorithm of the prior art. One iteration gets close to a lock and subsequent incremental updates can be used for achieving a precise lock. The calibration circuit can be used for any application that requires calibrating a delay line to a reference clock. The calibration circuit can also be used for calibrating delay lines that are less than ideal and not perfectly linear. The calibration algorithm can be run continually or at any desired time such that any changes in process, voltage and temperature will be detected and the delay setting can be changed accordingly.

Although an embodiment of the calibrating circuit and algorithm are shown in the context of a DDR DRAM memory, the calibration circuit and algorithm can be used with other types of memory devices and in non-memory applications.

Although the present invention has been described with reference to preferred embodiments, workers skilled in the art will recognize that changes may be made in form and detail without departing from the spirit and scope of the invention.

What is claimed is:

1. A delay line calibration circuit, comprising:
   a programmable master delay line, which drives a delay clock and has a propagation delay that is a function of a delay setting;
   a delay counter, which is clocked by the delay clock and has a delay count;
   a reference counter, which is clocked by a reference clock and has a reference count; and
   a control circuit, which controls the delay and reference counters, compares a representation of the delay count to a representation of the reference count and responsively generates a modified value for the delay setting to reduce a difference between the representations of the delay count and the reference count.

2. The delay line calibration circuit of claim 1 and further comprising:
   a programmable slave delay line coupled in a circuit application, wherein the slave delay line has a propagation delay that is a function of the delay setting generated by the control circuit.

3. The delay line calibration circuit of claim 2 and further comprising:
   a slave delay control circuit, which selectively updates the propagation delay of the slave delay line by the modified value of the delay setting when the difference between representations of the delay count and the reference count is less than a predetermined amount.

4. The delay line calibration circuit of claim 1 wherein:
the reference counter comprises a count complete output, which is applied to the control circuit and indicates when the reference counter has reached a terminal count;
the control circuit initiates counting by the delay counter and the reference counter at a beginning of a calibration cycle and compares the delay count to a representation of the terminal count when the reference counter applies the count complete output to the control circuit at an end of the calibration cycle to produce the difference; and
the control circuit calculates the modified value for the delay setting based on the difference.

5. The delay line calibration circuit of claim 4 wherein:
the control circuit comprises a count enable output, which is applied to the delay counter and the reference counter; and
the control circuit activates the count enable output at the beginning of the calibration cycle and then deactivates the count enable output when the reference counter applies the count complete output to the control circuit.

6. The delay line calibration circuit of claim 4 wherein:
the reference counter comprises a terminal count control input, which sets the terminal count of the reference counter.

7. The delay line calibration circuit of claim 4 and further comprising a ring oscillator, wherein:
the programmable master delay line is coupled in a delay path within the ring oscillator to generate the delay clock.

8. The delay line calibration circuit of claim 7 wherein:
the delay clock generated by the ring oscillator has a period that is approximately twice the propagation delay through the master delay line and is approximately one half of the period of the reference clock;
the control circuit divides the delay count by one half to produce a normalized representation of the delay count and compares the normalized representation to the representation of the terminal count at an end of the calibration cycle.

9. The delay line calibration circuit of claim 4 wherein the reference clock has a period and the representation of the terminal count that the calibration circuit uses to compare to the representation of the delay count is set relative to an actual value of the terminal count of the reference counter such that the propagation delay through the master delay line is calibrated by the delay setting to be a target fraction of the reference clock period.

10. The delay line calibration circuit of claim 9 wherein the control circuit comprises a terminal value input for setting the representation of the terminal count.

11. The delay line calibration circuit of claim 1 wherein the control circuit identifies each bit of the representation of the delay count that differs from a corresponding bit of the representation of the reference count and, for each differing bit, varies the delay setting by a corresponding binary fractional amount to thereby generate the modified value of the delay setting.

12. A data capture circuit comprising:
a reference clock;
a data input and a strobe input, which has a predefined phase relationship with the data input;
a data capture circuit, which captures the data input as a function of a delayed strobe signal;
a programmable slave delay line coupled to the strobe input and generating the delayed strobe signal at an output thereof, wherein the slave delay line has a propagation delay that is a function of a delay setting;
a programmable master delay line, which drives a delay clock and has a propagation delay that is a function of the delay setting;
a delay counter, which is clocked by the delay clock and has a delay count;
a reference counter, which is clocked by the reference clock and has a reference count; and
a control circuit, which controls the delay and reference counters, compares a representation of the delay count to a representation of the reference count and responsively generates a modified value for the delay setting to reduce a difference between the representations of delay count and the reference count.

13. The data capture circuit of claim 12 and further comprising:
a slave delay control circuit, which selectively updates the propagation delay of the slave delay line by the modified value of the delay setting when the difference between representations of the delay count and the reference count is less than a predetermined amount.

14. The data capture circuit of claim 12 wherein:
the reference counter comprises a count complete output, which is applied to the control circuit and indicates when the reference counter has reached a terminal count;
the control circuit initiates counting by the delay counter and the reference counter at a beginning of a calibration cycle and compares the delay count to a representation of the terminal count when the reference counter applies the count complete output to the control circuit at an end of the calibration cycle to produce the difference; and
the control circuit calculates the modified value for the delay setting based on the difference.

15. The data capture circuit of claim 14 wherein:
the control circuit comprises a count enable output, which is applied to the delay counter and the reference counter; and
the control circuit activates the count enable output at the beginning of the calibration cycle and then deactivates the count enable output when the reference counter applies the count complete output to the control circuit.

16. The data capture circuit of claim 14 wherein:
the reference counter comprises a terminal count control input, which sets the terminal count of the reference counter.

17. The data capture circuit of claim 14 and further comprising a ring oscillator, wherein:
the programmable master delay line is coupled in a delay path within the ring oscillator to generate the delay clock.

18. The data capture circuit of claim 17 wherein:
the delay clock generated by the ring oscillator has a period that is approximately twice the propagation delay through the master delay line and is approximately one half of the period of the reference clock;
the control circuit divides the delay count by one half to produce a normalized representation of the delay count and compares the normalized representation to the representation of the terminal count at an end of the calibration cycle.

19. The data capture circuit of claim 14 wherein the reference clock has a period and the representation of the terminal count that the calibration circuit uses to compare to the representation of the delay count is set relative to an actual value of the terminal count of the reference counter such that the propagation delay through the master delay line is calibrated by the delay setting to be a target fraction of the reference clock period.

20. The data capture circuit of claim 19 wherein the control circuit comprises a terminal value input for setting the representation of the terminal count.

21. The data capture circuit of claim 12 wherein the control circuit identifies each bit of the representation of the delay count that differs from a corresponding bit of the representation of the reference count and, for each differing bit, varies the delay setting by a corresponding binary fractional amount to thereby generate the modified value of the delay setting.

22. A method of calibrating propagation delay through a programmable delay line to a reference clock, the method comprising:

(a) generating a delay clock with a clock generator having a programmable master delay line, which controls a period of the delay clock based on a delay setting;

(b) initiating a delay counter, which is clocked by the delay clock and has a delay count;

(c) initiating a reference counter, which is clocked by the reference clock and has a reference count, when the delay counter is initiated in (b); and (d) comparing a representation of the delay count to a representation of the reference count with a control circuit when the reference count reaches a terminal count, the control circuit responsively generating a modified value for the delay setting to reduce a difference between the representations of the delay count and the reference count.

* * * * *